US012787443B2

(12) United States Patent
Yuan et al.

(10) Patent No.: US 12,787,443 B2
(45) Date of Patent: Nov. 3, 2026

(54) ARRAY SUBSTRATE AND DISPLAY PANEL

(71) Applicant: HKC CORPORATION LIMITED, Shenzhen (CN)

(72) Inventors: Xin Yuan, Shenzhen (CN); Haijiang Yuan, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 442 days.

(21) Appl. No.: 18/517,375

(22) Filed: Nov. 22, 2023

(65) Prior Publication Data

US 2024/0429250 A1 Dec. 26, 2024

(30) Foreign Application Priority Data

Jun. 21, 2023 (CN) ........................ 202310748639.7

(51) Int. Cl.

| | |
|---|---|
| ***H10D 86/60*** | (2025.01) |
| ***H10D 86/40*** | (2025.01) |
| ***H10K 59/12*** | (2023.01) |
| ***H10K 59/122*** | (2023.01) |

(52) U.S. Cl.

CPC ........... *H10D 86/60* (2025.01); *H10D 86/423* (2025.01); *H10D 86/481* (2025.01); *H10K 59/1201* (2023.02); *H10K 59/122* (2023.02)

(58) Field of Classification Search

None

See application file for complete search history.

(56) References Cited

U.S. PATENT DOCUMENTS

2011/0151600 A1* 6/2011 Oh ........................ H10D 86/481 438/34
2016/0322449 A1* 11/2016 Pyon .................. H10K 59/1216
2017/0090259 A1* 3/2017 Wang ................ G02F 1/133514

(Continued)

FOREIGN PATENT DOCUMENTS

CN 107039351 A 8/2017
CN 107731858 A 2/2018

(Continued)

OTHER PUBLICATIONS

Chinese First Office Action,Chinese Application No. 202310748639.7, mailed Mar. 31, 2024 (14 pages).

(Continued)

*Primary Examiner* — Steven B Gauthier
*Assistant Examiner* — E. Rhett Cheek

(57) ABSTRACT

The present application provides an array substrate and a display panel. The array substrate includes a substrate, a polycrystalline silicon active layer, a first gate insulating layer, a first metal layer, a second gate insulating layer, and an oxide active layer. The oxide active layer includes a first channel region and first doped regions arranged on both sides of the first channel region; the first metal layer is processed by a single photomask process to form a first gate, a first source and a first drain spaced apart; the first gate is arranged directly below the first channel region; the first source and the first drain are respectively connected to the first doped regions on both sides of the first channel region, and the first source or the first drain extends along the direction away from the first gate, serving as a lower polar plate layer of the storage capacitor.

16 Claims, 6 Drawing Sheets

(56) References Cited

U.S. PATENT DOCUMENTS

| | | | | |
|---|---|---|---|---|
| 2022/0130933 | A1* | 4/2022 | Yu | H10D 86/60 |
| 2022/0148516 | A1* | 5/2022 | Hwang | G09G 3/3233 |
| 2022/0149133 | A1* | 5/2022 | Lee | H10K 59/1213 |
| 2022/0173191 | A1* | 6/2022 | Kim | H10K 59/1216 |
| 2022/0190079 | A1 | 6/2022 | Noh et al. | |
| 2022/0208932 | A1* | 6/2022 | Yun | H10K 59/1216 |
| 2023/0207570 | A1* | 6/2023 | Noh | H10K 59/1216 257/72 |
| 2023/0290883 | A1* | 9/2023 | Tsai | H10D 30/6757 |
| 2024/0063233 | A1* | 2/2024 | Luo | H10D 86/0231 |
| 2026/0223538 | A1* | 7/2026 | Murashige | H10K 59/1213 |

FOREIGN PATENT DOCUMENTS

| | | | |
|---|---|---|---|
| CN | 110690170 | A | 1/2020 |
| CN | 111403419 | A | 7/2020 |
| CN | 113629072 | A | 11/2021 |
| CN | 114203732 | A | 3/2022 |
| CN | 115483227 | A | 12/2022 |
| WO | 2019000493 | A1 | 1/2019 |

OTHER PUBLICATIONS

Chinese Notification to Grant Patent Right for Invention, Chinese Application No. 202310748639.7, mailed Apr. 21, 2024 (5 pages).

* cited by examiner

ARRAY SUBSTRATE AND DISPLAY PANEL

CROSS REFERENCE TO RELATED APPLICATIONS

This application claims priority to Chinese Patent Application No. 202310748639.7, filed on Jun. 21, 2023 in the National Intellectual Property Administration of China, the contents of which are herein incorporated by reference in their entirety.

TECHNICAL FIELD

The present disclosure relates to the field of display technologies, and in particular to an array substrate and a display panel.

BACKGROUND

The low temperature poly-silicon (LTPS) display panel technology and the indium gallium zinc oxide (Oxide) display panel technology are combined to obtain a low temperature polysilicon oxide (LTPO) display panel. The LTPO display panel not only has the advantages of the LTPS display panel such as high resolution, high response speed, high brightness, high opening rate and the like, but also has the advantages of low power consumption and support for 1~120 Hz refresh rates.

However, the current LTPO back panel needs to take into account two kinds of Thin Film Transistor (TFT) devices, so the production process of the back panel usually needs to use at least 13 to 17 photomask processes, the production cost is high, and the production process is complex.

SUMMARY

The present disclosure provides an array substrate and a display panel, which can solve the problems of the existing array substrate and the display panel with high production cost and complex process.

In some aspects of the present disclosure, an array substrate is provided. The array substrate includes: a substrate, a polycrystalline silicon active layer, a first gate insulating layer, a first metal layer, a second gate insulating layer and an oxide active layer. The polycrystalline silicon active layer is arranged on a side of the substrate; the first gate insulating layer is arranged on the side of the substrate and covering the polycrystalline silicon active layer; the first metal layer is arranged on a side of the first gate insulating layer away from polycrystalline silicon active layer; the second gate insulating layer is arranged on the side of the first gate insulating layer away from the polycrystalline silicon active layer and covering the first metal layer; and the oxide active layer is arranged on a side of the second gate insulating layer away from the first gate insulating layer; wherein the oxide active layer includes a first channel region and first doped regions arranged on both sides of the first channel region; the first metal layer is processed by a single photomask process to form a first gate, a first source and a first drain spaced apart; the first gate is arranged directly below the first channel region; the first source and the first drain are respectively connected to the first doped regions on both sides of the first channel region, and the first source or the first drain extends along the direction away from the first gate and serves as a lower polar plate layer of the storage capacitor.

In some embodiments, the first metal layer further includes a second gate formed under the same photomask process as the first gate, the first source and the first drain, and the second gate is spaced apart from the first gate, the first source and the first drain; and the polycrystalline silicon active layer includes a second channel region and second doped regions arranged on both sides of the second channel region, and the second gate is disposed directly above the second channel region.

In some embodiments, the array substrate further includes an interlayer dielectric layer and a second metal layer, the interlayer dielectric layer is arranged on a side of the second gate insulating layer away from the first gate insulating layer, and covering the oxide active layer; the second metal layer is arranged on a side of the interlayer dielectric layer away from the second gate insulating layer; wherein the second metal layer is processed by a single photomask process to form a second source, a second drain, a first conductive layer and a second conductive layer spaced apart; the second source and the second drain are respectively connected to the second doped regions on both sides of the second channel region through second contact holes, the first conductive layer and the second conductive layer are respectively connected to the first source and the first drain through third contact holes; the second contact holes penetrate through the first gate insulating layer, the second gate insulating layer and the interlayer dielectric layer; the third contact holes penetrate through the second gate insulating layer and the interlayer dielectric layer. The second contact holes and the third contact holes are formed by a same photomask process.

In some embodiments, the second metal layer further includes an upper polar plate layer formed in the same photomask process as the second source, the second drain, the first conductive layer and the second conductive layer, and the upper polar plate layer is spaced apart from the second source, the second drain, the first conductive layer and the second conductive layer; wherein the upper polar plate layer is provided in correspondence with an extended portion of the first source or an extended portion of the first drain to cooperate with the extended portion of the first source or the extended portion of the first drain to form the storage capacitor.

In some embodiments, the second metal layer further includes a third gate formed in the same photomask process as the second source, the second drain, the first conductive layer, and the second conductive layer, and the third gate is spaced apart from the second source, the second drain, the first conductive layer and the second conductive layer; wherein, the third gate is disposed directly above the first channel region.

In some embodiments, the array substrate further includes a passivation layer, a flattening layer and an anode, the passivation layer is arranged on a side of the interlayer dielectric layer away from the second gate insulating layer and covering the second metal layer; the flattening layer is arranged on a side of the passivation layer away from the interlayer dielectric layer; the anode is formed by a single photomask process using an anode layer arranged on a side of the flattening layer away from the passivation layer; wherein the anode is connected to the second drain through a fourth contact hole, and the fourth contact hole penetrates through the passivation layer and the flattening layer.

In some embodiments, the array substrate further includes a pixel defining layer and a support layer, the pixel defining layer is arranged on a side of the flattening layer away from the passivation layer, wherein the pixel defining layer has a first opening for accommodating a light-emitting device, and at least a portion of the anode is exposed from the first opening; and the support layer is arranged on a side of the pixel defining layer away from the flattening layer, wherein the support layer has a second opening corresponding to the first opening.

In some embodiments, the first opening and the second opening are formed in a same photomask process.

In some embodiments, the array substrate further includes a buffer layer and a fourth gate, the buffer layer is arranged between the substrate and the first gate insulating layer; the fourth gate is arranged on a side of the substrate proximate to the buffer layer and located directly below the second channel region.

In some aspects of the present disclosure, a display panel is provided. The display panel includes an array substrate and a color film substrate, the array substrate is the array substrate of any one of the foregoing; the color film substrate is arranged on a side of the array substrate away from the substrate.

Different from the related art, beneficial effects of the present disclosure are as follows. The present disclosure provides an array substrate and a display panel, wherein a first gate, a first source, a first drain of an oxide active layer and a lower polar plate of a storage capacitor are formed through a single photomask process. Accordingly, the present disclosure can reduce the photomask processes in the process of substrate fabrication, and thereby reduce the fabrication cost and simplify the fabrication process.

BRIEF DESCRIPTION OF THE DRAWINGS

In order to illustrate more clearly the technical solutions in the embodiments of the present disclosure, the following is a brief description of the accompanying drawings used in the description of the embodiments. Obviously, the drawings are only some of the embodiments of the present disclosure, and other drawings may be obtained from these drawings without creative work by those skilled in the art.

Figure 1:
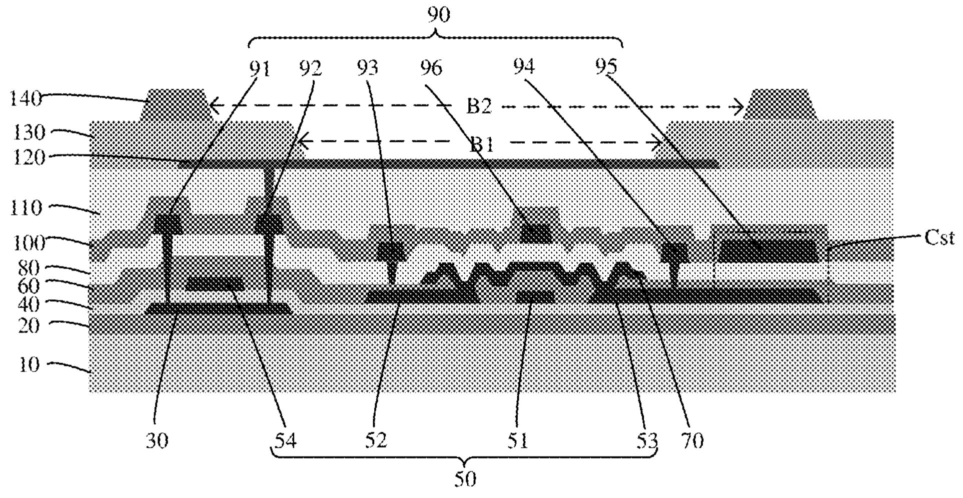
FIG. 1 is a schematic structural view of an array substrate of some embodiments of the present disclosure.

Reference signs in the drawings: substrate 10; buffer layer 20; polycrystalline silicon active layer 30; first gate insulating layer 40; first metal layer 50; first gate 51; first source 52; first drain 53; second gate 54; second gate insulating layer 60; oxide active layer 70; interlayer dielectric layer 80; second metal layer 90; second source 91; second drain 92; first conductive layer 93; second conductive layer 94; upper polar plate layer 95; passivation layer 100; flattening layer 110; anode 120; pixel defining layer 130; support layer 140; fourth gate 150; storage capacitor Cst; first contact hole A1; second contact hole A2; third contact hole A3; fourth contact hole A4; first opening B1; second opening B2; first transistor T1; second transistor T2; third transistor T3; fourth transistor T4; fifth transistor T5; sixth transistor T6; driving transistor DT; light-emitting device OLED; reset signal Vint; data voltage Data; first scanning signal Scan1; second scanning signal Scan2; light-emitting control signal EM; high-potential power supply VDD; low-potential power supply VSS; array substrate 1000; color film substrate 2000.

DETAILED DESCRIPTION

The terms “first”, “second” and “third” in this present disclosure are used for descriptive purposes only and are not to be construed as indicating or implying relative importance or implicitly specifying the number of technical features indicated. Thus, a feature defined with “first”, “second”, “third” may include at least one such feature, either explicitly or implicitly. In the description of the present disclosure, “plurality” means at least two, e.g., two, three, etc., unless otherwise expressly and specifically limited. All directional indications (e.g., up, down, left, right, forward, backward . . . ) in the embodiments of the present disclosure are only used to explain the relative positional relationship, movement, etc. between the components in a particular attitude (as shown in the accompanying drawings), and the directional indications are changed accordingly if the particular attitude is changed. Furthermore, the terms “including” and “having” and any variations thereof are intended to cover non-exclusive inclusion. For example, a process, method, system, product or apparatus including a series of operations or units is not limited to the listed operations or units, but optionally also includes operations or units that are not listed, or optionally includes other operations or units that are inherent to the process, method, product or apparatus.

Reference to “embodiments” herein implies that particular features, structures, or characteristics described in conjunction with embodiments may be included in the embodiment of the present disclosure. The presence of the phrase at various points in the specification does not necessarily refer to the same embodiment, nor is it a separate or alternative embodiment that is mutually exclusive of other embodiments. It is understood by those skilled in the art, both explicitly and implicitly, that the embodiments described herein may be combined with other embodiments.

The technical solutions in the embodiments of the present disclosure will be described clearly and completely in the following in conjunction with the accompanying drawings in the embodiments of the present disclosure, and it is obvious that the described embodiments are only a part of the embodiments of the present disclosure, and not all of the embodiments. Based on the embodiments in the present disclosure, all other embodiments obtained by a person of ordinary skill in the art without making creative labor fall within the scope of protection of the present disclosure.

As described in the background, the fabrication process of existing LTPO back panel usually requires the use of at least 13 to 17 photomask processes, the fabrication process is complex, and the photomask equipment is one of the most expensive tools in the manufacturing of display panels, which will bring huge capital expenditures to the manufacturers.

As shown in FIG. 1, FIG. 1 is a schematic structural view of an array substrate of some embodiments of the present disclosure. To solve the above problems, embodiments of the present disclosure provide an array substrate. The array substrate includes a substrate 10, a polycrystalline silicon active layer 30, a first gate insulating layer 40, a first metal layer 50, a second gate insulating layer 60 and an oxide active layer 70 which are disposed in a stack. Specifically, the polycrystalline silicon active layer 30 is arranged on a side of the substrate 10, the first gate insulating layer 40 is arranged on a side of the substrate 10 and covering the polycrystalline silicon active layer 30, the first metal layer 50 is arranged on a side of the first gate insulating layer 40 away from polycrystalline silicon active layer 30, the second gate insulating layer 60 is arranged on the side of the first gate insulating layer 40 away from the polycrystalline silicon active layer 30 and covering the first metal layer 50, and the oxide active layer 70 is arranged on a side of the second gate insulating layer 60 away from the first gate insulating layer 40.

In some embodiments, the oxide active layer 70 is formed as an active layer of an oxide TFT by a single photomask process, and the oxide active layer 70 includes a first channel region and first doped regions arranged on both sides of the first channel region. The first metal layer 50 is processed by a single photomask process to form a first gate 51, a first source 52 and a first drain 53 spaced apart. The first gate 51 is arranged directly below the first channel region; the first source 52 and the first drain 53 are respectively connected to the first doped regions on both sides of the first channel region, and the first source 52 or the first drain 53 extends along the direction away from the first gate 51 and serves as a lower polar plate layer of the storage capacitor Cst.

The present disclosure forms the first gate 51, the first source 52, the first drain 53 for the oxide active layer 70 and the lower polar plate of the storage capacitor Cst by the single photomask process, which can reduce the photomask processes in the substrate fabrication process, thereby reducing the fabrication cost and simplifying the fabrication process of the back panel.

In some embodiments, in the array substrate shown in FIG. 1, the first drain 53 extends in a direction back away from the first gate 51 to serve as the lower polar plate layer of the storage capacitor Cst. In other embodiments, it is also possible that the first source 52 extends toward the direction back away from the first gate 51 to serve as the lower polar plate layer of the storage capacitor Cst. The details may be designed according to the actual situation and will not be limited herein.

In an embodiment, after forming the second gate insulating layer 60, the single photomask process is also required to be performed on the second gate insulating layer 60 to form the first contact holes A1 (referring to FIG. 7), and the first source 52 and the first drain 53 are respectively connected to the first doped regions on both sides of the first channel region through the first contact holes A1.

In some embodiments, the polycrystalline silicon active layer 30 as an active layer of the LTPS TFT, is formed by the single photomask process to include a second channel region and second doped regions arranged on both sides of the second channel region to be used for connecting to a gate, a source and a drain of the LTPS TFT, respectively in a subsequent fabrication process.

In an embodiment, the first metal layer 50 further includes a second gate 54 formed under the same photomask process as the first gate 51, the first source 52 and the first drain 53, and the second gate 54 is spaced apart from the first gate 51, the first source 52 and the first drain 53. The second gate 54 is disposed directly above the second channel region to serve as a gate for the LTPS TFT. The polycrystalline silicon active layer 30 can be doped and semiconducted by using the second gate 54 as a photomask to form the second channel region and the second doped regions arranged on both sides of the second channel region.

The first gate 51, the first source 52, the first drain 53, the second gate 54 and the lower polar plate of the storage capacitor Cst are formed under the same photomask process. Accordingly, the present disclosure reduces the photomask processes in the substrate fabrication process, thereby reducing the fabrication cost, and simplifying the fabrication process of the back panel.

In an embodiment, the array substrate further includes an interlayer dielectric layer 80 and a second metal layer 90. The interlayer dielectric layer 80 is arranged on the side of the second gate insulating layer 60 away from the first gate insulating layer 40, and covering the oxide active layer 70; the second metal layer 90 is arranged on a side of the interlayer dielectric layer 80 away from the second gate insulating layer 60.

In some embodiments, the second metal layer 90 is processed by a single photomask process to form a second source 91, a second drain 92, a first conductive layer 93 and a second conductive layer 94 spaced apart. The second source 91 and the second drain 92 are respectively connected to the second doped regions on both sides of the second channel region through second contact holes A2 (referring to FIG. 9). The first conductive layer 93 and the second conductive layer 94 are respectively connected to the first source 52 and the first drain 53 through third contact holes A3.

In some embodiments, the second contact holes A2 penetrate through the first gate insulating layer 40, the second gate insulating layer 60 and the interlayer dielectric layer 80. The second source 91 is connected to a second doped region through a second contact hole A2 to serve as the source of the LTPS TFT. The second drain 92 is connected to another second doped region through a second contact hole A2 to serve as the drain of the LTPS TFT.

In the substrate wiring, the gate line (generally transverse) and the source line and the drain line (generally longitudinal) extend in different directions. Therefore, in order to avoid short-circuiting the first gate 51, the first source 52 and the first drain 53 provided in the same layer having an intersection point, in an embodiment, the second metal layer 90 is set to include the first conductive layer 93 and the second conductive layer 94, and the third contact holes A3 penetrate the second gate insulating layer 60 and the interlayer dielectric layer 80, so that at the intersection point of the first source 52 and the first gate 51, and at the intersection point of the first drain 53 and the first gate 51, the first source 52 and the first drain 53 are connected to the first conductive layer 93 and the second conductive layer 94 respectively through a third contact hole A3 (referring to FIG. 9) to avoid a short-circuit of the line.

In some embodiments, the second contact holes A2 and the third contact holes A3 are formed by a same photomask process in order to simplify the photomask process so as to reduce the production cost. Specifically, since the first source 52 and the first drain 53 are metallic materials, the third contact holes A3 formed in the photomask process cannot penetrate the first source 52 and the first drain 53, whereas the second contact holes A2 formed in the same photomask process can penetrate further into the first gate insulating layer 40 because it is not blocked by the metallic material.

In an embodiment, the second metal layer 90 further includes an upper polar plate layer 95 of the storage capacitor Cst formed in the same photomask process as the second source 91, the second drain 92, the first conductive layer 93 and the second conductive layer 94. The upper polar plate layer 95 is spaced apart from the second source 91, the second drain 92, the first conductive layer 93 and the second conductive layer 94. The upper polar plate layer 95 is provided in correspondence with an extended portion of the first source 52 or an extended portion of the first drain 53 to cooperate with the extended portion of the first source 52 or the extended portion of the first drain 53 to form the storage capacitor Cst.

As shown in the array substrate of FIG. 1, the upper polar plate is provided in correspondence with the extended portion of the first drain 53 to cooperate with the extended portion of the first drain 53 to form the storage capacitor Cst.

In an embodiment, the second source 91, the second drain 92, the first conductive layer 93, the second conductive layer 94 and the lower plate of the storage capacitor Cst are formed under the same photomask process, which further reduces the photomask processes in the process of substrate fabrication, thereby reducing the fabrication cost, and simplifying the fabrication process of the backplane.

In an embodiment, the second metal layer 90 further includes a third gate 96 formed in the same photomask process as the second source 91, the second drain 92, the first conductive layer 93 and the second conductive layer 94. The third gate 96 is spaced apart from the second source 91, the second drain 92, the first conductive layer 93 and the second conductive layer 94. The third gate 96 is disposed directly above the first channel region. Specifically, the oxide TFT in this embodiment is a dual gate structure, with the first gate 51 serving as the bottom gate of the oxide active layer 70, and the third gate 96 serving as the top gate of the oxide active layer 70. The dual-gate structure can enhance the control ability of the gates on the carriers, improve the pinch-off characteristics of the device, and can enable the thermal resistance of the TFT to be greatly reduced, with high heat dissipation performance.

In some embodiments, the oxide active layer 70 may be doped and semiconducted by using the third gate 96 as a photomask to form a first channel region and first doped regions arranged on both sides of the first channel region.

In an embodiment, the array substrate further includes a passivation layer 100, a flattening layer 110 and an anode 120 set in a stack. Specifically, the passivation layer 100 is arranged on a side of the interlayer dielectric layer 80 away from the second gate insulating layer 60 and covering the second metal layer 90; the flattening layer 110 is arranged on a side of the passivation layer 100 away from the interlayer dielectric layer 80; the anode 120 is formed by a single photomask process using an anode layer arranged on a side of the flattening layer 110 away from the passivation layer 100. The anode 120 is connected to the second drain 92 through a fourth contact hole A4 (referring to FIG. 11). The fourth contact hole A4 penetrates through the passivation layer 100 and the flattening layer 110.

After forming the passivation layer 100 and the flattening layer 110, the passivation layer 100 and the flattening layer 110 are processed by the single photomask process to form the fourth contact hole A4 running through the passivation layer 100 and the flattening layer 110, wherein the fourth contact hole A4 is provided corresponding to the second drain 92. An anode layer is then deposited on the side of the flattening layer 110 away from the passivation layer 100, and the single photomask process is performed on the anode layer to form the anode 120 of the light-emitting device, and the anode 120 is connected to the second drain 92 through the fourth contact hole A4.

In an embodiment, the array substrate further includes a pixel defining layer 130 and a support layer 140. The pixel defining layer 130 is arranged on a side of the flattening layer 110 away from the passivation layer 100. The pixel defining layer 130 has a first opening B1 for accommodating a light-emitting device, at least a portion of the anode 120 is exposed from the first opening B1. The support layer 140 is arranged on a side of the pixel defining layer 130 away from the flattening layer 110 and the support layer 140 has a second opening B2 corresponding to the first opening B1.

The first opening B1 is for accommodating a light-emitting device and the anode 120 is at least partially exposed through the first opening B1 for electrically connecting to the light-emitting device accommodated within the first opening B1.

The support layer 140 is used to support other film layers or substrates (e.g., color film substrates) thereon to protect the light-emitting device from scratching.

The first opening B1 and the second opening B2 may be formed by the single photomask process respectively. For example, after forming the pixel defining layer 130, the pixel defining layer 130 is subjected to the single photomask process to form the first opening B1 in the pixel defining layer 130. The support layer 140 is then formed on the pixel defining layer 130 forming the first opening B1, and another single photomask process is performed to form a second opening B2 at a location of the support layer 140 corresponding to the first opening B1.

In contrast, in the present embodiment, the first opening B1 and the second opening B2 are formed under the same photomask process in order to simplify the photomask process so as to reduce the production cost. Specifically, this embodiment employs the Half Tone Mask process to perform the photomask process on the cascading pixel defining layer 130 and the support layer 140 to form the first opening B1 and the second opening B2.

The array substrate provided by the present disclosure is different from the related art using 13 to 17 photomask processes for production and formation, and the present disclosure can be formed with only 9 photomask processes, which greatly reduces the number of photomasks in the production process, and thus reduces the production cost, and simplifies the production process.

Figure 2:
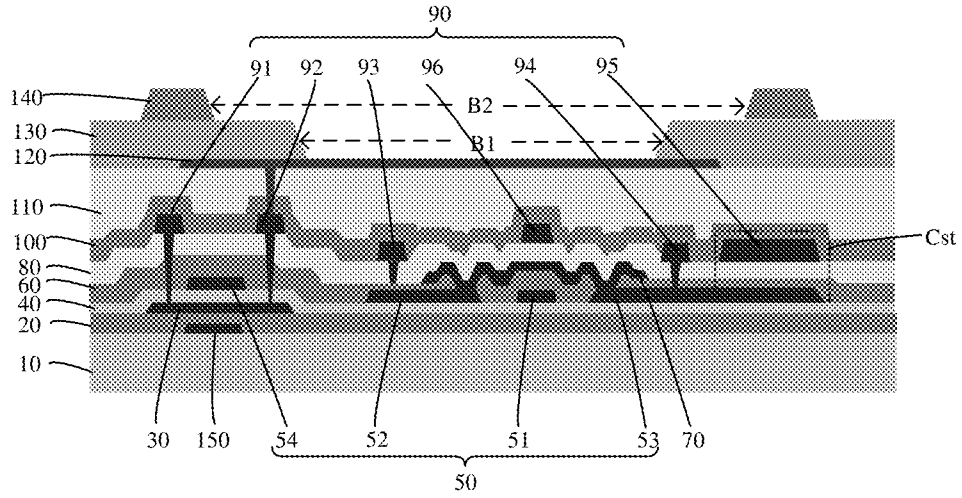
FIG. 2 is a schematic structural view of the array substrate of another embodiment of the present disclosure.

Referring to FIG. 2, FIG. 2 is a schematic structural view of the array substrate of another embodiment of the present disclosure. In other embodiments of the present disclosure, the array substrate further includes a buffer layer 20 and a fourth gate 150, specifically, the buffer layer 20 is arranged between the substrate 10 and the first gate insulating layer 40; and the fourth gate 150 is arranged on a side of the substrate 10 proximate to the buffer layer 20 and located directly below the second channel region to serve as the bottom gate of the LTPS TFT. Specifically, the LTPS TFT in this embodiment is a double gate structure, with the second gate 54 serving as a top gate of the polycrystalline silicon active layer 30, and the fourth gate 150 serving as a bottom gate of the polycrystalline silicon active layer 30 for shading. The fourth gate 150 may be formed by performing the single photomask process on a metal layer arranged on the substrate 10.

Figure 3:
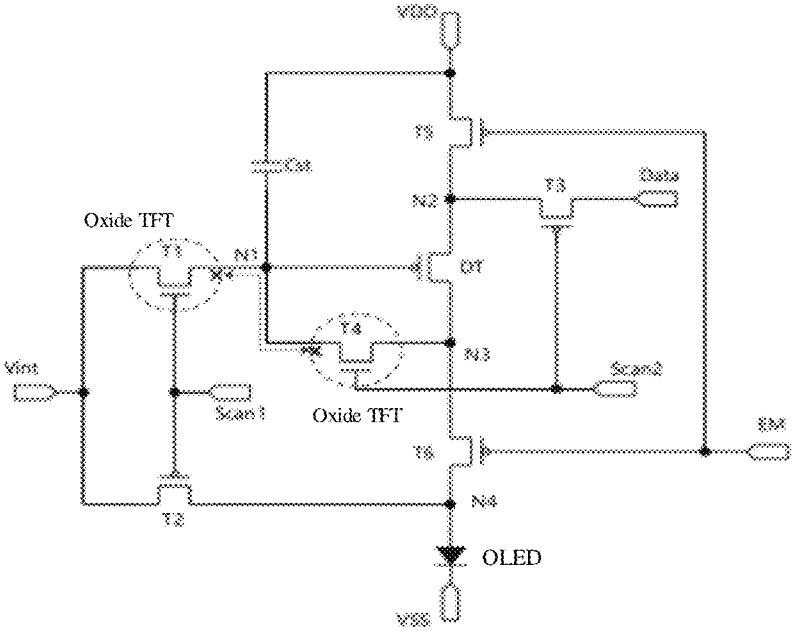
FIG. 3 is a schematic structural view of a pixel driver circuit of some embodiments of the present disclosure.
Figure 4:
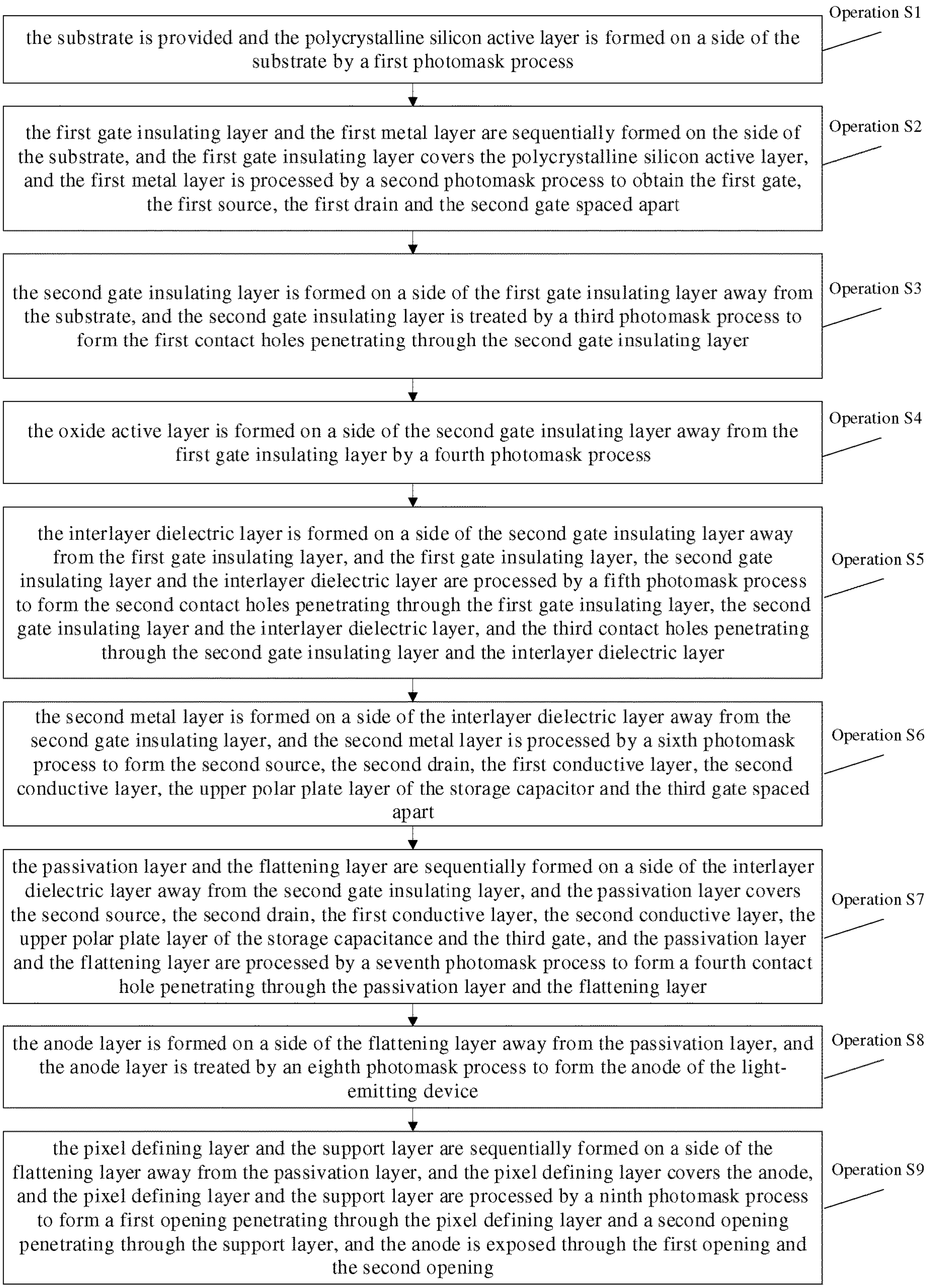
FIG. 4 is a schematic flow view of a method of preparing an array substrate of some embodiments of the present disclosure.

Referring to FIG. 3, FIG. 3 is a schematic structural view of the pixel driver circuit of some embodiments of the present disclosure. The pixel driving circuit includes a reset unit, a writing unit, a storage unit, a driving unit, a light-emitting control unit, and a light-emitting device OLED which are coupled.

In at least one embodiment, the driving unit includes a driving transistor DT, the driving transistor DT being used to generate a driving current for driving the light-emitting device OLED to emit light. The storage unit includes a storage capacitor Cst, and the storage capacitor Cst is used to save information such as a data voltage and a threshold voltage Vth of the drive transistor DT.

The reset unit includes a first transistor T1 and a second transistor T2, and in the reset stage, a first scanning signal Scan1 controls the first transistor T1 and the second transistor T2 to conduct, and a reset signal Vint is reset through the first transistor T1 for the gates of the storage capacitor Cst and the drive transistor DT, and through the second transistor T2 for the anode of the light-emitting device OLED.

The writing unit includes a third transistor T3 and a fourth transistor T4, and in the data writing stage, the second scanning signal Scan2 controls the third transistor T3 and the fourth transistor T4 to conduct, and the data voltage Data is written to the storage capacitor Cst through the third transistor T3, the driving transistor DT, and the fourth transistor T4.

The light-emitting control unit includes a fifth transistor T5 and a sixth transistor T6, and in the light-emitting stage, the light-emitting control signal EM controls the conductivity of the fifth transistor T5 and the sixth transistor T6 so as to conduct the pathway between the high-potential power supply VDD, the drive transistor DT, the light-emitting device OLED, and the low-potential power supply VSS, so as to cause the light-emitting device OLED to emit light.

In some embodiments, the first transistor T1 and the fourth transistor T4 use an Oxide TFT, and the remaining transistors may use an LTPS TFT. Specifically, the Oxide TFT has a lower leakage current, and thus replacing the TFT on the leakage path at the NI node with an Oxide TFT reduces the risk of leakage of electricity from the NI node, so that the data voltage Data present at the NI node can be maintained for a longer period of time so that the brightness does not change due to leakage in the low refresh rate display mode. As a result, backplanes designed based on this feature can realize low refresh rate displays and therefore display power consumption is greatly reduced.

Figure 5:
FIG. 5 is a schematic structural view of an intermediate product of the array substrate after operation S1 in FIG. 4.
Figure 6:
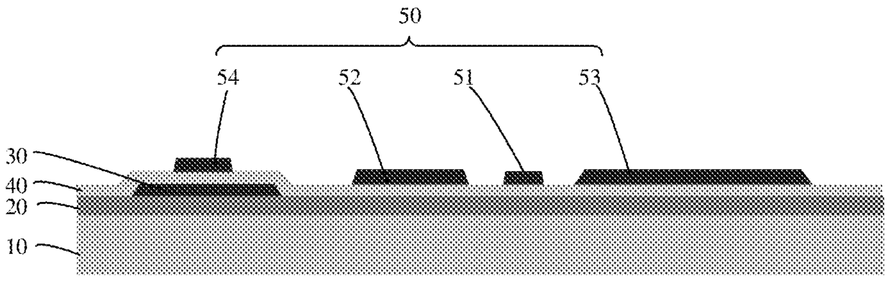
FIG. 6 is a schematic structural view of an intermediate product of the array substrate after operation S2 in FIG. 4.
Figure 7:
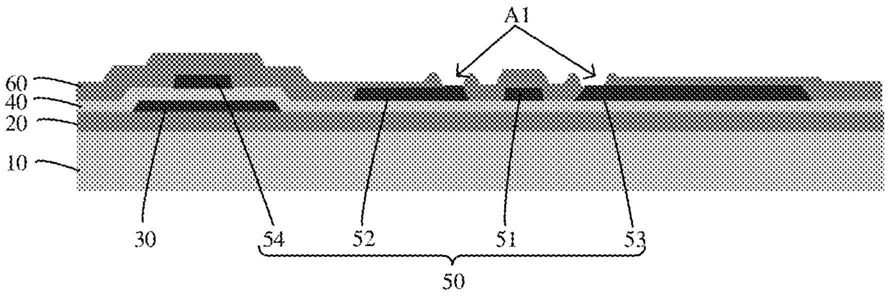
FIG. 7 is a schematic structural view of an intermediate product of the array substrate after operation S3 in FIG. 4.
Figure 8:
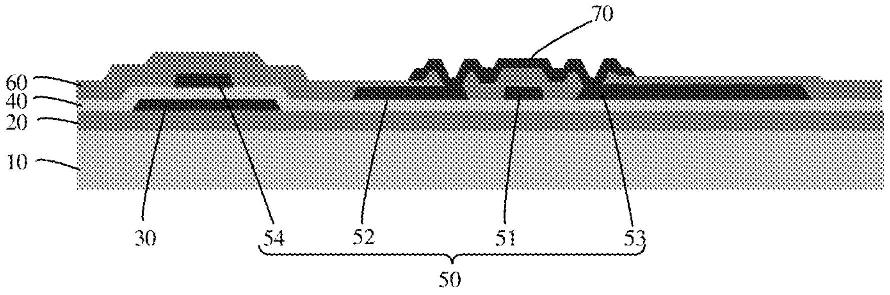
FIG. 8 is a schematic structural view of an intermediate product of the array substrate after operation S4 in FIG. 4.
Figure 9:
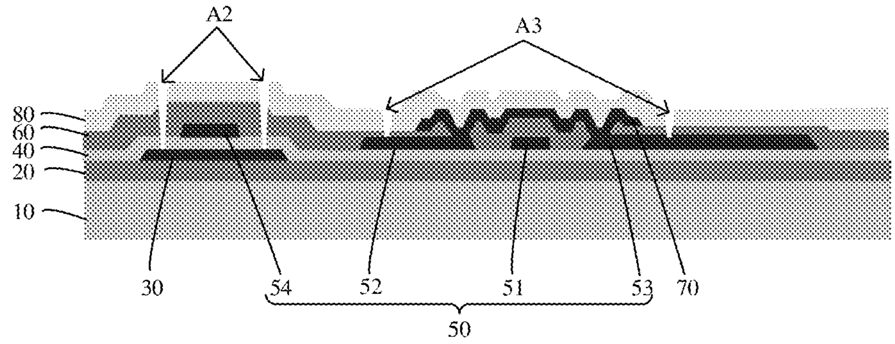
FIG. 9 is a schematic structural view of an intermediate product of the array substrate after operation S5 in FIG. 4.
Figure 10:
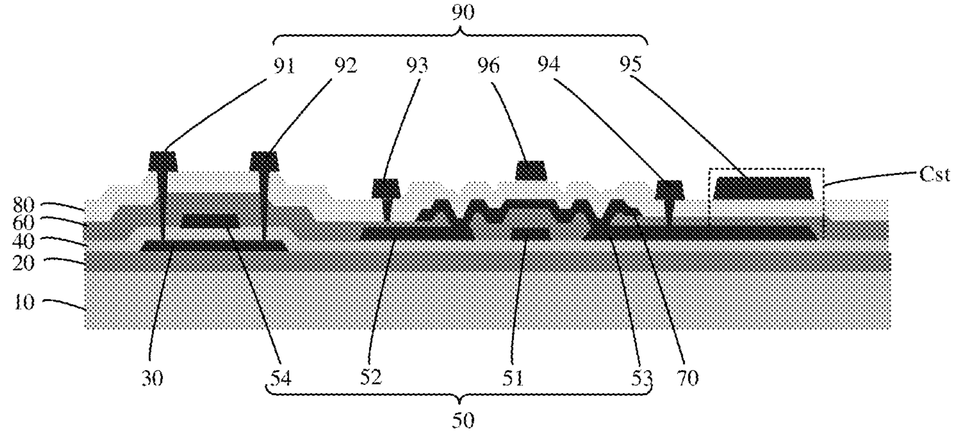
FIG. 10 is a schematic structural view of an intermediate product of the array substrate after operation S6 in FIG. 4.
Figure 11:
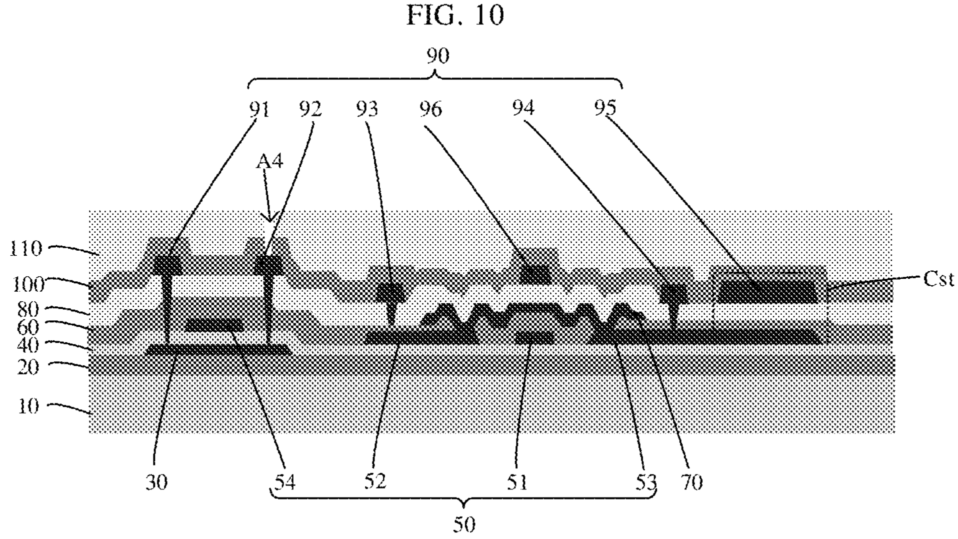
FIG. 11 is a schematic structural view of an intermediate product of the array substrate after operation S7 in FIG. 4.
Figure 12:
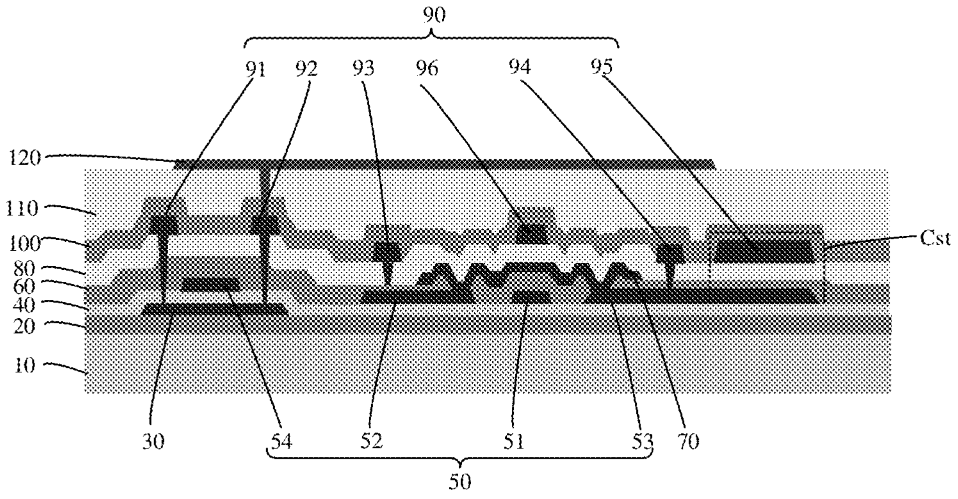
FIG. 12 is a schematic structural view of an intermediate product of the array substrate after operation S8 in FIG. 4.
Figure 13:
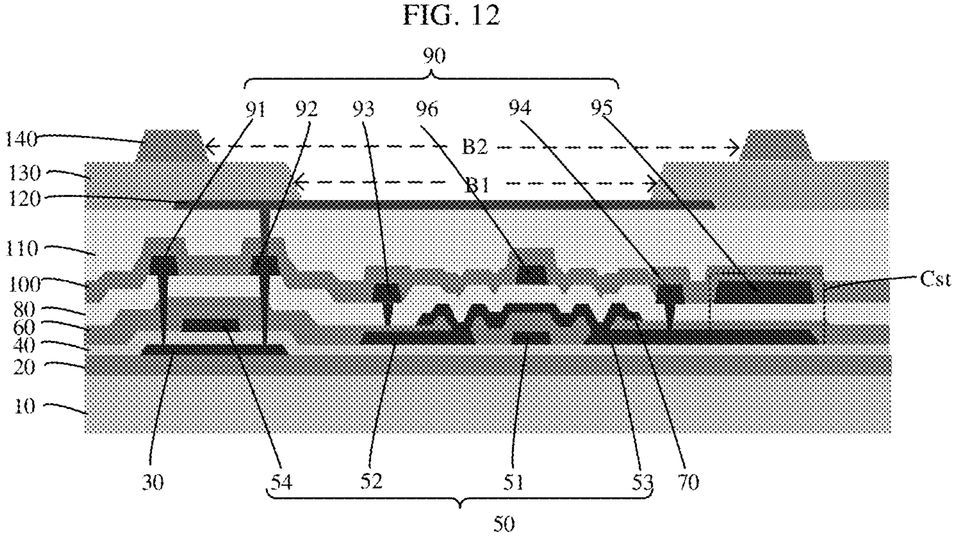
FIG. 13 is a schematic structural view of an intermediate product of the array substrate after operation S9 in FIG. 4.

Referring to FIG. 4 to FIG. 13, FIG. 4 is a schematic flow view of a method of preparing an array substrate of some embodiments of the present disclosure. FIG. 5 is a schematic structural view of an intermediate product of the array substrate after operation S1 in FIG. 4. FIG. 6 is a schematic structural view of an intermediate product of the array substrate after operation S2 in FIG. 4. FIG. 7 is a schematic structural view of an intermediate product of the array substrate after operation S3 in FIG. 4. FIG. 8 is a schematic structural view of an intermediate product of the array substrate after operation S4 in FIG. 4. FIG. 9 is a schematic structural view of an intermediate product of the array substrate after operation S5 in FIG. 4. FIG. 10 is a schematic structural view of an intermediate product of the array substrate after operation S6 in FIG. 4. FIG. 11 is a schematic structural view of an intermediate product of the array substrate after operation S7 in FIG. 4. FIG. 12 is a schematic structural view of an intermediate product of the array substrate after operation S8 in FIG. 4. FIG. 13 is a schematic structural view of an intermediate product of the array substrate after operation S9 in FIG. 4.

The present disclosure also provides a method of preparing the array substrate. The method specifically includes the following operations.

Operation S1: the substrate 10 is provided and the polycrystalline silicon active layer 30 is formed on a side of the substrate 10 by a first photomask process.

The substrate 10 may be a rigid substrate or a flexible substrate, wherein the material of the rigid substrate includes, but is not limited to, glass, and the material of the flexible substrate includes, but is not limited to, PI and SiOx.

The polycrystalline silicon active layer 30 is obtained from a-Si by ELA laser crystallization to p-Si and treated by the single photomask process to serve as the active layer of the LTPS TFT. The polycrystalline silicon active layer 30 has a second channel region and second doped regions arranged on both sides of the second channel region.

In at least one embodiment, prior to forming the polycrystalline silicon active layer 30, it is also necessary to form the buffer layer 20 on the substrate 10, the material of the buffer layer 20 includes but not limited to SiOx and SiNx. The polycrystalline silicon active layer 30 is arranged on the side of the buffer layer 20 that is backed away from the substrate 10.

Operation S2: the first gate insulating layer 40 and the first metal layer 50 are sequentially formed on the side of the substrate 10, and the first gate insulating layer 40 covers the polycrystalline silicon active layer 30, and the first metal layer 50 is processed by a second photomask process to obtain the first gate 51, the first source 52, the first drain 53 and the second gate 54 spaced apart.

In some embodiments, the second gate 54 is disposed directly above the second channel region to serve as the gate of the LTPS TFT.

In some embodiments, the polycrystalline silicon active layer 30 is also doped and semiconducted by the second gate 54 acting as a photomask to form the second channel region and the second doped regions arranged on both sides of the second channel region.

In some embodiments, the first gate 51 is used as a bottom gate of the Oxide TFT, the first source 52 and the first drain 53 are used as the source and the drain of the Oxide TFT, and the first source 52 or the first drain 53 is further used as a lower polar plate layer of the storage capacitor Cst.

In some embodiments, the first source 52 or the first drain 53 extends in a direction back away from the first gate 51 to serve as a lower polar plate layer of the storage capacitor Cst.

Operation S3: the second gate insulating layer 60 is formed on a side of the first gate insulating layer 40 away from the substrate 10, and the second gate insulating layer 60 is treated by a third photomask process to form the first contact holes A1 penetrating through the second gate insulating layer 60.

The first contact holes A1 are provided in correspondence with the first source 52 and the first drain 53 so that the first source 52 and the first drain 53 are connected to the doped regions of the oxide active layer 70 through the first contact holes A1.

Operation S4: the oxide active layer 70 is formed on a side of the second gate insulating layer 60 away from the first gate insulating layer 40 by a fourth photomask process.

An IGZO material layer is formed on the side of the second gate insulating layer 60 away from the first gate insulating layer 40, and the photomask process is performed on the IGZO material layer to form the oxide active layer 70 to serve as an active layer for the Oxide TFT.

Operation S5: the interlayer dielectric layer 80 is formed on a side of the second gate insulating layer 60 away from the first gate insulating layer 40, and the first gate insulating layer 40, the second gate insulating layer 60 and the interlayer dielectric layer 80 are processed by a fifth photomask process to form the second contact holes A2 penetrating through the first gate insulating layer 40, the second gate insulating layer 60 and the interlayer dielectric layer 80, and the third contact holes A3 penetrating through the second gate insulating layer 60 and the interlayer dielectric layer 80.

The second contact holes A2 are provided corresponding to the second doped regions on both sides of the second channel region so that the second doped regions on both sides of the second channel region are connected to the source and the drain of the LTPS TFT through the second contact holes A2, respectively.

The third contact holes A3 are provided corresponding to the first source 52 and the first drain 53, and since the first source 52 and the first drain 53 are metallic materials, thus, in the photomask process, the formed third contact holes A3 cannot penetrate the first source 52 and the first drain 53. And in the substrate wiring, the gate line (generally transverse) and the source line and the drain line (generally longitudinal) extend in different directions. Therefore, in order to avoid short-circuiting the first gate 51, the first source 52 and the first drain 53 provided in the same layer having an intersection point, in an embodiment, at the intersection point of the first source 52 and the first gate 51, and at the intersection point of the first drain 53 and the first gate 51, the first source 52 and the first drain 53 are connected to the first conductive layer 93 and the second conductive layer 94 respectively through a third contact hole A3 to avoid a short-circuit of the line.

Operation S6: the second metal layer 90 is formed on a side of the interlayer dielectric layer 80 away from the second gate insulating layer 60, and the second metal layer 90 is processed by a sixth photomask process to form the second source 91, the second drain 92, the first conductive layer 93, the second conductive layer 94, the upper polar plate layer 95 of the storage capacitor Cst and the third gate 96 spaced apart.

The second source 91 is connected to the second doped region through the second contact hole A2 to serve as the source of the LTPS TFT; and the second drain 92 is connected to another second doped region through the second contact hole A2 to serve as the drain of the LTPS TFT.

The first source 52 and the first drain 53 are jumper connected to the first conductive layer 93 and the second conductive layer 94, respectively through the third contact hole A3 to avoid short-circuiting of the source, the drain, and the gate of the Oxide TFTs set in the same layer.

In some embodiments, the oxide active layer 70 may be doped and semiconducted by using the third gate 96 as a photomask so that the oxide active layer 70 forms the first channel region and the first doped regions arranged on both sides of the first channel region. The third gate 96 is disposed directly above the first channel region. Specifically, the Oxide TFT in the embodiment is a dual gate structure, with the first gate 51 serving as the bottom gate of the oxide active layer 70 and the third gate 96 serving as the top gate of the oxide active layer 70. The dual-gate structure can enhance the control ability of the gate s on the carriers, improve the pinch-off characteristics of the device, and can enable the thermal resistance of the TFT to be greatly reduced, with high heat dissipation performance.

The upper polar plate layer 95 is provided in correspondence with the extended portion of the first source 52 or the extended portion of the first drain 53 to cooperate with the extended portion of the first source 52 or the extended portion of the first drain 53 to form the storage capacitor Cst.

Operation S7: the passivation layer 100 and the flattening layer 110 are sequentially formed on a side of the interlayer dielectric layer 80 away from the second gate insulating layer 60, and the passivation layer 100 covers the second source 91, the second drain 92, the first conductive layer 93, the second conductive layer 94, the upper polar plate layer 95 of the storage capacitance Cst and the third gate 96, and the passivation layer 100 and the flattening layer 110 are processed by a seventh photomask process to form a fourth contact hole A4 penetrating through the passivation layer 100 and the flattening layer 110.

The fourth contact hole A4 is provided in correspondence with the second drain 92 to allow the second drain 92 to be connected to the subsequent process forming the anode 120 through the fourth contact hole A4.

Operation S8: the anode layer is formed on a side of the flattening layer 110 away from the passivation layer 100, and the anode layer is treated by an eighth photomask process to form the anode 120 of the light-emitting device.

Operation S9: the pixel defining layer 130 and the support layer 140 are sequentially formed on a side of the flattening layer 110 away from the passivation layer 100, and the pixel defining layer 130 covers the anode 120, and the pixel defining layer 130 and the support layer 140 are processed by a ninth photomask process to form a first opening B1 penetrating through the pixel defining layer 130 and a second opening B2 penetrating through the support layer 140, and the anode 120 is exposed through the first opening B1 and the second opening B2.

The embodiment uses the halftone mask process to photomask the stacked pixel defining layer 130 and the support layer 140 to form the first opening B1 and the second opening B2. The first opening B1 is used to accommodate the light-emitting device, and the anode 120 is exposed at least partially through the first opening B1 for electrically connecting with the light-emitting device accommodated in the first opening B1; the support layer 140 is used to support the light-emitting device in the first opening B1; and the support layer 140 is used to support other film layers or substrates (e.g., a color film substrate) thereon to protect the light-emitting device from scratching.

Distinguishing from the related art, the present disclosure provides the array substrate that can be formed with only 9 photomask processes, which greatly reduces the number of photomasks in the fabrication process, thereby reducing the fabrication cost and simplifying the fabrication process.

Figure 14:
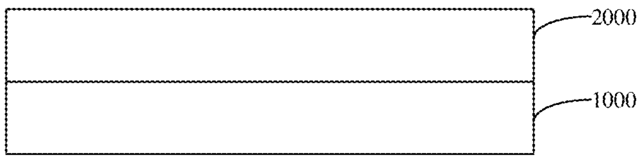
FIG. 14 is a schematic structural view of a display panel of some embodiments of the present disclosure.

Referring to FIG. 14, FIG. 14 is a schematic structural view of a display panel of some embodiments of the present disclosure. The present disclosure also provides a display panel, the display panel includes the array substrate 1000 and a color film substrate 2000. The array substrate 1000 is an array substrate formed by any of the above embodiments and preparation methods; the color film substrate 2000 is arranged on the side of the array substrate 1000 away from the substrate for filtering the light-emitting devices in the array substrate 1000.

In some embodiments, the display panel may be applied to devices such as cell phones, computers, tablets, smart watches, and the like.

The above is only the implementation method of the present disclosure, not to limit the patent scope of the present disclosure, where the use of the present disclosure specification and the accompanying drawings of the equivalent structure or equivalent process transformation, or directly or indirectly used in other related technical fields, are included in the scope of patent protection of present disclosure.

What is claimed is:

1. An array substrate, comprising:

a substrate;

a polycrystalline silicon active layer, arranged on a side of the substrate;

a first gate insulating layer, arranged on the side of the substrate and covering the polycrystalline silicon active layer;

a first metal layer, arranged on a side of the first gate insulating layer away from polycrystalline silicon active layer;

a second gate insulating layer, arranged on the side of the first gate insulating layer away from the polycrystalline silicon active layer and covering the first metal layer;

an oxide active layer, arranged on a side of the second gate insulating layer away from the first gate insulating layer;

wherein the oxide active layer comprises a first channel region and first doped regions arranged on both sides of the first channel region; the first metal layer is processed by a single photomask process to form a first gate, a first source and a first drain spaced apart; the first gate is arranged directly below the first channel region, the first source and the first drain are respectively connected to the first doped regions on both sides of the first channel region, and the first source or the first drain extends along a direction away from the first gate and serves as a lower polar plate layer of a storage capacitor;

wherein the first metal layer further comprises a second gate formed under the same photomask process as the first gate, the first source and the first drain, and the second gate is spaced apart from the first gate, the first source and the first drain;

the polycrystalline silicon active layer comprises a second channel region and second doped regions arranged on both sides of the second channel region, and the second gate is disposed directly above the second channel region;

wherein the array substrate further comprises:

an interlayer dielectric layer, arranged on a side of the second gate insulating layer away from the first gate insulating layer, and covering the oxide active layer; and a second metal layer, arranged on a side of the interlayer dielectric layer away from the second gate insulating layer;

wherein the second metal layer is processed by a single photomask process to form a second source, a second drain, a first conductive layer and a second conductive layer spaced apart; the second source and the second drain are respectively connected to the second doped regions on both sides of the second channel region through second contact holes, the first conductive layer and the second conductive layer are respectively connected to the first source and the first drain through third contact holes;

the second contact holes penetrate through the first gate insulating layer, the second gate insulating layer and the interlayer dielectric layer; the third contact holes penetrate through the second gate insulating layer and the interlayer dielectric layer, and the second contact holes and the third contact holes are formed by a same photomask process.

2. The array substrate as claimed in claim 1, wherein the second metal layer further comprises an upper polar plate layer formed in the same photomask process as the second source, the second drain, the first conductive layer and the second conductive layer, and the upper polar plate layer is spaced apart from the second source, the second drain, the first conductive layer and the second conductive layer;

wherein the upper polar plate layer is provided in correspondence with an extended portion of the first source or an extended portion of the first drain to cooperate with the extended portion of the first source or the extended portion of the first drain to form the storage capacitor.

3. The array substrate as claimed in claim 1, wherein the second metal layer further comprises a third gate formed in the same photomask process as the second source, the second drain, the first conductive layer and the second conductive layer, and the third gate is spaced apart from the second source, the second drain, the first conductive layer, and the second conductive layer; wherein the third gate is disposed directly above the first channel region.

4. The array substrate as claimed in claim 1, wherein the array substrate further comprises:

a passivation layer, arranged on a side of the interlayer dielectric layer away from the second gate insulating layer and covering the second metal layer;

a flattening layer, arranged on a side of the passivation layer away from the interlayer dielectric layer; and an anode, formed by a single photomask process using an anode layer arranged on a side of the flattening layer away from the passivation layer; wherein the anode is connected to the second drain through a fourth contact hole, and the fourth contact hole penetrates through the passivation layer and the flattening layer.

5. The array substrate as claimed in claim 4, wherein the array substrate further comprises:

a pixel defining layer, arranged on a side of the flattening layer away from the passivation layer, wherein the pixel defining layer has a first opening for accommodating a light-emitting device, and at least a portion of the anode is exposed from the first opening; and a support layer, arranged on a side of the pixel defining layer away from the flattening layer, wherein the support layer has a second opening corresponding to the first opening.

6. The array substrate as claimed in claim 5, wherein the first opening and the second opening are formed in a same photomask process.

7. The array substrate as claimed in claim 1, wherein the array substrate further comprises:

a buffer layer, arranged between the substrate and the first gate insulating layer;

a fourth gate, arranged on a side of the substrate proximate to the buffer layer and located directly below the second channel region.

8. The array substrate as claimed in claim 1, wherein the array substrate further comprises a pixel driving circuit, the pixel driving circuit comprises a reset unit, a writing unit, a storage unit, a driving unit, a light-emitting control unit, and a light-emitting device which are coupled.

9. A display panel, comprising:

an array substrate; and a color film substrate, arranged on a side of the array substrate away from the substrate;

wherein the array substrate comprises: a substrate, a polycrystalline silicon active layer, a first gate insulating layer, a first metal layer, a second gate insulating layer and an oxide active layer; the polycrystalline silicon active layer is arranged on a side of the substrate; the first gate insulating layer is arranged on the side of the substrate and covering the polycrystalline silicon active layer; the first metal layer is arranged on a side of the first gate insulating layer away from polycrystalline silicon active layer; the second gate insulating layer is arranged on the side of the first gate insulating layer away from the polycrystalline silicon active layer and covering the first metal layer; and the oxide active layer is arranged on a side of the second gate insulating layer away from the first gate insulating layer; wherein the oxide active layer includes a first channel region and first doped regions arranged on both sides of the first channel region; the first metal layer is processed by a single photomask process to form a first gate, a first source and a first drain spaced apart; the first gate is arranged directly below the first channel region; the first source and the first drain are respectively connected to the first doped regions on both sides of the first channel region, and the first source or the first drain extends along a direction away from the first gate and serves as a lower polar plate layer of a storage capacitor;

wherein the first metal layer further comprises a second gate formed under the same photomask process as the first gate, the first source and the first drain, and the second gate is spaced apart from the first gate, the first source and the first drain;

the polycrystalline silicon active layer comprises a second channel region and second doped regions arranged on both sides of the second channel region, and the second gate is disposed directly above the second channel region, wherein the array substrate further comprises:

an interlayer dielectric layer, arranged on a side of the second gate insulating layer away from the first gate insulating layer, and covering the oxide active layer; and a second metal layer, arranged on a side of the interlayer dielectric layer away from the second gate insulating layer;

wherein the second metal layer is processed by a single photomask process to form a second source, a second drain, a first conductive layer and a second conductive layer spaced apart; the second source and the second drain are respectively connected to the second doped regions on both sides of the second channel region through second contact holes, the first conductive layer and the second conductive layer are respectively connected to the first source and the first drain through third contact holes;

the second contact holes penetrate through the first gate insulating layer, the second gate insulating layer and the interlayer dielectric layer; the third contact holes penetrate through the second gate insulating layer and the interlayer dielectric layer, and the second contact holes and the third contact holes are formed by a same photomask process.

10. The display panel as claimed in claim 9, wherein the second metal layer further comprises an upper polar plate layer formed in the same photomask process as the second source, the second drain, the first conductive layer and the second conductive layer, and the upper polar plate layer is spaced apart from the second source, the second drain, the first conductive layer and the second conductive layer;

wherein the upper polar plate layer is provided in correspondence with an extended portion of the first source or an extended portion of the first drain to cooperate with the extended portion of the first source or the extended portion of the first drain to form the storage capacitor.

11. The display panel as claimed in claim 9, wherein the second metal layer further comprises a third gate formed in the same photomask process as the second source, the second drain, the first conductive layer and the second conductive layer, and the third gate is spaced apart from the second source, the second drain, the first conductive layer, and the second conductive layer; wherein the third gate is disposed directly above the first channel region.

12. The display panel as claimed in claim 9, wherein the array substrate further comprises:

a passivation layer, arranged on a side of the interlayer dielectric layer away from the second gate insulating layer and covering the second metal layer;

a flattening layer, arranged on a side of the passivation layer away from the interlayer dielectric layer; and an anode, formed by a single photomask process using an anode layer arranged on a side of the flattening layer away from the passivation layer; wherein the anode is connected to the second drain through a fourth contact hole, and the fourth contact hole penetrates through the passivation layer and the flattening layer.

13. The display panel as claimed in claim 12, wherein the array substrate further comprises:

a pixel defining layer, arranged on a side of the flattening layer away from the passivation layer, wherein the pixel defining layer has a first opening for accommodating a light-emitting device, and at least a portion of the anode is exposed from the first opening; and a support layer, arranged on a side of the pixel defining layer away from the flattening layer, wherein the support layer has a second opening corresponding to the first opening.

14. The display panel as claimed in claim 13, wherein the first opening and the second opening are formed in a same photomask process.

15. The display panel as claimed in claim 9, wherein the array substrate further comprises:

a buffer layer, arranged between the substrate and the first gate insulating layer;

a fourth gate, arranged on a side of the substrate proximate to the buffer layer and located directly below the second channel region.

16. The display panel as claimed in claim 9, wherein the array substrate further comprises a pixel driving circuit, the pixel driving circuit comprises a reset unit, a writing unit, a storage unit, a driving unit, a light-emitting control unit, and a light-emitting device which are coupled.

* * * * *